United States Patent [19]

Wolf et al.

[11] Patent Number: 4,913,768

[45] Date of Patent: Apr. 3, 1990

[54] PROCESS FOR PRODUCING ELECTRICAL CONDUCTOR BOARDS

[75] Inventors: Gerhard D. Wolf, Dormagen; Kirkor Sirinyan, Bergisch-Gladbach; Ulrich von Gizycki; Rudolf Merten, both of Leverkusen; Friedrich Langer, Bergisch-Gladbach, all of Fed. Rep. of Germany

[73] Assignee: Bayer Aktiengesellschaft, Leverkusen, Fed. Rep. of Germany

[21] Appl. No.: 293,261

[22] Filed: Jan. 4, 1989

[30] Foreign Application Priority Data

Jan. 13, 1988 [DE] Fed. Rep. of Germany ....... 3800682

[51] Int. Cl.$^4$ ............................ C23F 1/00; B44C 1/22; C03C 15/00; C03C 25/06
[52] U.S. Cl. ....................................... 156/645; 29/852; 156/656; 156/659.1; 156/666; 156/902; 427/97; 427/98
[58] Field of Search ............... 156/629, 634, 645, 656, 156/659.1, 661.1, 666, 901, 902; 252/79.2, 79.5; 427/96, 97, 98; 174/68.5; 428/601, 137, 209, 901; 29/846, 852

[56] References Cited

U.S. PATENT DOCUMENTS

| | | | |
|---|---|---|---|
| 4,260,449 | 4/1981 | Berdan et al. | 156/902 X |
| 4,285,991 | 8/1981 | Gedrat et al. | 29/852 X |
| 4,512,829 | 4/1985 | Ohta et al. | 427/97 X |
| 4,582,564 | 4/1986 | Shanefield et al. | 156/902 X |
| 4,820,547 | 4/1989 | Linday et al. | 427/97 |

FOREIGN PATENT DOCUMENTS 54-71371  6/1979  Japan .................... 29/852

*Primary Examiner*—William A. Powell
*Attorney, Agent, or Firm*—Sprung Horn Kramer & Woods

[57] ABSTRACT

Conductor boards with well adhering conductor tracks are obtained if the substrates, which are clad on both sides with copper foils, have said cladding removed chemically or mechanically, are activated, if necessary sensitized, and are provided with a 0.05–2.0 μm thick layer of nickel, cobalt, manganese, a nickel/iron or nickel/cobalt mixture in an electroless metallizing bath, a 0.5–5.0 μm thick copper layer is applied in a subsequent copper bath and the conductor pattern is then built up by the standard semi-additive methods.

9 Claims, No Drawings

PROCESS FOR PRODUCING ELECTRICAL CONDUCTOR BOARDS

The subject of the invention are a process for producing high-quality conductor boards and also the conductor boards thus produced and their use for producing printed circuits.

It is generally known that, to produce electrical conductor boards, drilled holes are made in metal-clad or metal-laminated insulating base materials, the substrate surface is covered with a mask, the free metal surface is provided with an etchant-resistance metal resist by electroplating, the mask is removed from the substrate surface in a suitable medium and then the basic metal layer is etched away. The metal deposits used to carry out this process (subtractive process) are composed in most cases of pure electrolytic copper and, as a rule, have a layer thickness of 17.5 to 70 μm.

The known subtractive processes not only have the disadvantage that they comprise several substeps, but in the final step they result in undercutting of the conductor tracks.

A further disadvantage of the known processes is that they require metal resists.

When the metal resist deposit is applied, the metal resist growth by electroplating may also undergo profuse lateral growth. The term "overplating" or even "mushrooming" of the conductor tracks is used and this refers to the mushroom-like shape to be seen in cross-section and to the poor definition in depth. This undesired effect is intensified still further by the subsequent etching away of the basic copper layer. In order to avoid the said "overplating" or "mushrooming", mechanically rigid and thick foil resists have to be used.

Such mechanically rigid foil resists are intended to avoid "canalization" of both the copper conductors and the resist metal and, consequently, mushrooming.

A further very great disadvantage of metal resists is that they melt during soldering and result in the known orange-peel effect. This effect is unacceptable, particularly in the case of high-quality conductor boards.

As a particular disadvantage of the subtractive process, mention may be made of the fact that it is unsuitable for producing fine-conductor boards with a conductor track width of under 200 μm for the reasons mentioned.

In order to avoid the specified disadvantages, attempts have already been made to develop the so-called semi-additive and fully-additive processes. To carry out these processes, the application of a thin, solder-bath-resistant, electrically conductive metal deposit with good adhesion is of great importance.

It is furthermore known that the direct deposition of adhesive, relatively thin metal deposits (<5 μm) on the standard insulating base materials requires an expensive pretreatment. Thus, for example, the substrates of glass-mat-reinforced epoxy resins or paper-reinforced phenolic resins for producing conductor boards have first to be provided with an adhesion promoting layer and then to be treated with an oxidizing liquid, preferably chromo-sulphuric acid, before the boards so prepared are activated with ionic or colloidal noble-metal solutions, masked and metallized in commercial metallizing baths.

Apart from the many stages of this method, this technique has the disadvantage that entrained chromium ions poison the baths irreversibly and that the conductor boards obtained exhibit unsatisfactory electrical properties.

It has therefore already been proposed to activate the non-conducting surfaces of substrates, for example base carriers of conductor boards, with a solution or a lacquer of a noble-metal amine complex formation or of palladium chloride, without oxidative pretreatment, for the subsequent chemical metallization (cf., for example, DE-A-1,696,603 and DE-A-2,116,389, corresponding to US-A-2,560,257 and US-A-248,632, respectively).

These activation processes, which are material-conserving per se, have, however, hitherto been unable to establish themselves in practice, since they require relatively large quantities of noble metal and they do not achieve the peel strengths for metal deposits required in the electronics industry. For this reason, at least in the first mentioned patent publication, an additional surface treatment with etchant is recommended (cf. column 6, line 48).

Finally, it is known (cf. U.S. Patent Specification No. 3,620,933), that polymeric base materials of phenolic or epoxy resins which are provided with a subsequently oxidized aluminium foil can be processed to produce conductor boards after the chemical or physical removal of the metal deposit by standard semi-additive or subtractive processes without using etchant. However, this process has, in addition to various other disadvantages, the deficiency of resulting in the deposition of metal deposits with low peel strength. In addition, the electrical properties, such as electrical surface resistance and creep-current resistance, of the polymeric base material are irreversibly impaired by the thin metal oxide layer.

In order to avoid these disadvantages, the proposal has finally been made (cf. DE-A-3,510,202) to produce high-quality electrical conductor boards using a semiadditive or fully-additive method by applying the conductor pattern to the base material by wet-chemical means using organic noble-metal compounds as activators, the surface of the base material being characterized by face of the base material being characterized by (a) a specific total pore volume per unit area of 0.015 to 0.045 $dm^3/m^2$, (b) a mean pore diameter of 0.05 to 12.5 μm, and (c) a mean pore depth of 0.05 to 4.0 μm.

Such surface structures are preferably obtained by using those base materials which are clad with copper foils which normally have a special preparation on the side facing the base material. The preparation has, in fact, a special dentritic structure which is transferred to the polymeric carrier material during cladding and remains behind on the plastic surface after detaching the cladding mechanically or chemically.

Although substrates with surfaces prepared in this manner yield high-quality conductor boards without the above indicated deficiencies when the normal metallization techniques are used, they do not satisfy the highest requirements of the conductor board technique, in particular, not with reference to the production of superfine conductor boards, since in that case the reject rate is disproportionately high.

It has now been found that these deficiencies can be eliminated and satisfactory conductor boards be obtained if the substrates, which are clad with Cu foils on both sides, (a) have the copper cladding removed chemically or mechanically after cutting to size and drilling, (b) the surfaces of the substrates and the drilled hole walls are activated by immersion in an activator bath, and (c) are sensitized if necessary, (d) are provided with a 0.05-2.0 μm thick layer of nickel, cobalt, manganese, a nickel/iron or nickel/cobalt mixture in an electroless metallizing bath, (e) are provided with a 0.5-5.0 μm thick copper layer in a subsequent copper bath, and (f) the conductor pattern is built up thereon by standard semi-additive methods.

The practical implementation of the individual substeps (a)-(f) is carried out in the following manner:

The metallized substrates used as starting materials are, in particular, commercial board materials with plated-through holes, metal-clad on both sides and preferably copper-clad. The metal foils used for cladding, preferably copper foils, have a preparation produced by electroplating and with a specific dentritic structure has a particular porosity which is fundamentally responsible for the production of the specific surface finish of the base materials when applied to the polymeric carrier material.

The formation of the dentritic structure can be promoted by adding complexing agents based on cadmium, selenium and tellurnium to the electroplating baths or by subsequently roughening the electrolytic foil chemically or mechanically.

Particularly suitable is base material which is clad on one or both sides with a metal or plastic foil which has a "metal preparation" on the side facing the base material and which has the foil material removed by mechanically or chemically removing the foil, the metal preparation continuing to adhere to the base material.

Both acidic and also neutral and alkaline redox baths are suitable for detaching the metal cladding. For example, mention may be made of redox systems containing hydrochloric or sulphuric acid based on $H_2O_2$, $ClO_3$ and $Fe^{3+}$, and also ammonium-alkaline redox systems containing sodium chlorite and ammonium persulphate.

The activators used for activation are organic noble-metal compounds from the series comprising Pt, Pd, Au, Ag, Ru and/or Rh. Within this framework, both ionic or colloidal activator systems and also complex compounds of these noble metals with organic ligands are suitable.

Suitable inorganic activators are compounds of the elements of the first and eighth subgroup of the periodic system of elements and, to be specific, (a) compounds of the formula

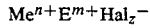

$$Me^{n+}E^{m+}Hal_z^-$$

in which Me stands for hydrogen, alkali-metal or alkaline-earth atoms or heavy metal atoms (Fe, Co, Ni or Cu) or for $NH_4$, Hal for halogen (preferably Cl and Br) and E for a noble-metal atom of the 1st or 8th subgroup of the periodic system (preferably Pt, Pd and Au) having the valency m or n respectively, and the co-ordination number n, where $z=m=n$, or (b) non-complex salts of these elements of the formula Preferred noble-metal compounds to be used are those of the formula $H_2PdCl_4$, $Na_2(PdCl_2Br_2)$, $Na_2PdCl_2$, $Ca\ PdCl_4$, $Na_4(PtCl_6)$, $AgNO_3$, $HAuCl_4$, $CuCl_2$ and CuCl. Preferred are the Pd compounds.

Other inorganic activators are colloidal systems of metallic Pd, Pt, Au and Ag which may optionally contain, in addition, hydrolysable compounds of elements of the 3rd and 4th main and subgroups of the periodic system (for example Si, Ti, Ta, Zn, Sn, Zr and Al).

Such activation systems are in some cases available commercially and, furthermore, have frequently been described in the literature.

Preferred are Pd and Pd/Sn systems.

Organic activators to be used according to the invention are noble-metal compounds known per se, for example Pd and Pt complexes of dienes, polymeric complexing agents and α,β-unsaturated ketones, such as are described, for example, in DE-A-3,025,307, 3,150,985 and 3,324,767.

Preferred are organometallic compounds, preferably organometallic complex compounds which, in addition to the group necessary to bind the metal, have at least one further functional group. Such compounds are known and are described in DE-A-3,148,280.

Further suitable activators are those noble-metal complex compounds in which the ligands and the ions or molecules to be complexed are in a "guest/host" relationship to each other.

Suitable selective complex ligands are cyclic or acyclic compounds which, owing to their chemical and/or physical nature, are a host molecule or, in the presence of ionogens or neutral compounds to be complexed, assume the form necessary for complex or adduct formation, the polar regions being directed, in the presence of the medium to be complexed, towards the latter. Such activators are described, for example, in U.S. Pat. Specification No. 4,661,384.

The reducing agents suitable for the sensitization are: aminoboranes, alkali-metal hypophosphites, alkyl borone hydrides, hydrazine hydrate and formalin.

The treatment of the substrates with the solutions or dispersions of activators and optionally, sensitizers, can be carried out by immersion, spraying, printing, soaking or impregnation.

A further embodiment of the activation comprises carrying out the reduction in the metallization bath directly with the reducing agent of the electroless metallization.

In order to increase the adhesion of the metal deposit to the carrier surface, those solvents or solvent mixtures are used preferably for the activators which result in a slight incipient dissolution or incipient swelling of the plastic surface to be metallised.

The activators may be used in concentration ranges from 0.001 g/l (relative to the noble metal) up to the respective solubility limit. Preferably, 0.1 to 3.0 g/l of these substances is used.

The electroless deposition of the first metal layer on the base material is carried out by method which are standard in electroplating.

Preferred layer thicknesses are 0.1-1.0 μm. The deposition rate should be 5-25, preferably 10-15 μm/h.

This requirement is achieved by rapidly depositing baths containing sodium hypophosphite which are obtainable commercially.

Preferred are nickel-plating baths containing hypophosphite.

The copper layer to be deposited thereon in a thickness of 0.5 to 5.0 μm is likewise carried out by standard methods either electrolessly, i.e. in a chemical copper bath (basket technique) or alternatively electro-chemically (rack technique).

The buildup of the conductor pattern is carried out by the known semi-additive differential etching method, i.e. the substrate coated with the thin metal deposit of, preferably, nickel and the copper deposit is, after applying a mask, provided with a second metal layer of, preferably, copper (for specific purposes, also gold) by chemical or, preferably, electroplating means.

The layer thickness of this metal deposit is 20–70, preferably 30–45 μm.

After removing the mask, the exposed nickel/copper layer is removed in standard etching bath (differential etching process).

The masking is likewise carried out by techniques known per se, for example by printing on UV-curing resists, applying screen-printed masks or UV-curing foils.

The masks are removed mechanically by peeling off or by dissolving off in suitable solvents.

In order, if necessary, to increase the adhesion of the metal deposit deposited on the carrier or in order to ensure a high process reliability, an annealing may be carried out after the chemical copper plating. A notable feature is that, surprisingly, the annealing is carried out, in contrast to the other processes (see, for example, DE-A-3,242,162 and U.S. Pat. Specification No. 4,327,126) on boards which are already cured, and this renders the process universally applicable, i.e. independent of the storage time of the carrier material.

The annealing temperature may be varied in a wide range from 50° C. up to the respective decomposition range of the polymeric base material. Preferred are temperatures of 120°–150° C. The annealing can be varied between 5 minutes and 10 hours, the times of 10 to 60 minutes being particularly to be preferred. In order to avoid a degradation of the base material, the annealing can be carried out under inert gas.

Preferred materials for producing the substrates are hot-curable or thermosetting plastics (English: thermosetting resins) such as phenolic, epoxy, melamine or polyester resins, the phenolic acid and epoxy resins being used by very particular preference in the standard sizes of FR-2, FR-3, FR-4 and FR-5.

The thermosetting substrates may be reinforced with reinforcing materials, such as glass, mineral, carbon and aramide fibres or mats, and their mixtures with each other.

Good adhesive strengths of the metal deposits on the base materials are achieved by the process according to the invention. The peel strength of the metal deposits as specified in DIN 53 494 are at least 40 N/25 mm, as a rule, however, between 45 and 50 N/25 mm.

Single-layer or multilayer printed circuits of the most varied types can be produced by the process according to the invention. Particularly preferably, two-layer conductor boards with plated-through holes are produced.

It should be particularly emphasized that the new process makes possible the virtually reject-free production of super-fine conductor boards with track widths of less than 100 μm.

The process is explained in more detail with reference to the following examples.

EXAMPLE 1

A commercial glass-mat reinforced epoxy resin board (FR-4), copper-clad on both sides, has the Cu deposit removed by etching off in an alkaline 15.7% sodium chloride solution (pH approx. 12), is decontaminated in 2% $NaHSO_3$ solution, washed with $H_2O$ and then with methanol, and dried. A board which is porous at the surface and which has a specific total pore volume per unit area of 0.028 $dm^3/m^2$ and a mean pore diameter of 2.0 μm or a mean pore depth of 2.5 μm is obtained. It is then activated for 5 minutes in a solution consisting of 1.58 g of 4-cyclohexene-1,2-dicarboxylicanhydride-palladium(II) chloride, 1500 ml of after-purified $CH_2Cl_2$ and 2.15 g of tetrabutyltitanate, then dried and sensitized in a solution composed of 750 ml of $H_2O$ dest., 7.5 g of dimethylamine borane and 1.75 g of NaOH (solid), and nickel-plated for 100 seconds in a commercial nickel-plating bath containing hypophosphite, a nickel layer of about 0.2 μm thickness being deposited. Then a 2 μm thick copper layer is applied in a likewise commercial chemical copper bath, washed with $N_2O$ dest., and annealed in a drying oven at 150° C. The specimen thus provided with a well adhering, electrically conducting metal deposit of approx. 2.2 μm is covered with the aid of the screen printing process with an electroplating resist in the form of strips which are 25 mm wide and also are at a distance of 25 mm from each other, and then the exposed metal surface is reinforced with electroplated copper to approx. 45 μm. The specimen body now has the mask removed from it in methyl ethyl ketone and the Cu deposit deposited chemically thereunder is etched off in a solution of 500 ml $H_2O$ dest., 8.5 ml of HCl (high purity, 37%) and 18.5 ml of $H_2O_2$ (differential etching process).

A conductor board having 150 μm wide and approx. 40 μm thick tracks is obtained. The adhesive strengths of the copper tracks were determined in accordance with DIN 53 494. An adhesive strength of 46 N/25 mm was measured.

COMPARATIVE EXAMPLE

If the procedure is as described in the above example, without, however, a thin nickel layer being deposited on the substrate after the activation and sensitization, an approx. 2.0 μm thick copper layer is deposited in a chemical copper bath, the latter is reinforced by electroplating and the process sequence as specified above is followed, then an adhesive force of the copper tracks on the base material is ultimately measured of only 35 N/25 mm.

EXAMPLE 2

A Cu-clad epoxy resin board of FR-4 material and cut to Europa format has the Cu deposit removed in a redox solution composed of 50 ml of HCl (37%), 60 ml of $N_2O_2$ and 50 ml of $H_2O$. A board with porous surface is obtained which has a specific total pore volume per unit area of 0.024 $dm^3/cm^2$ and a mean pore diameter of 2.5 μm or a maximum pore depth of 3.0 μm. This board is activated in a solution composed of 200 ml of acetone, 800 ml of $H_2O$ dest. and 0.8 g of mesitylene oxide-palladium chloride in the course of 3 minutes. Then the board is treated for 5 minutes in a solution of 5 g of dimethylamineborane in 1 l of $H_2O$/methanol mixture (50:50% by volume). After a short rinse an approx. 0.15 μm thick nickel layer is applied in approx. 1½ minutes in a commercial nickel bath containing hypophosphite which deposits approx. 6 μm of nickel/hour. Then, 3 μm of copper is deposited in a commercial chemical copper bath, washed with water and annealed in a drying oven at 160° C. The subsequent process sequence is carried out as described in the comparison example. The adhesive strength of the 40 μm thick copper tracks measured in accordance with DIN 53 494 is 45 N/25 mm.

A similar result is obtained if an FR-2 board is used instead of the FR-4 board.

EXAMPLE 3

A glass-mat-reinforced epoxy resin board (FR-4), copper-coated on both sides, is drilled and then has the dust removed from it. This board has the Cu deposit removed from it by etching off in an alkaline 15.7% sodium chloride solution (pH approx. 12), is decontaminated in 2% $NaHSO_3$ solution, washed with $H_2O$ and methanol, and dried. A board which is porous at the surface is obtained which has a specific total pore volume per unit area of 0.024 $dm^3/m^2$. It is then activated for 5 minutes in a solution composed of 1.2 g of $Na_2PdCl_4$ (high-purity), 1 l of after-purified methanol and 2.15 g of tetrabutyl titanate, dried and then sensitized in a solution composed of 750 ml of $H_2O$ dest., 7.5 g of dimethylamine-borane and 1.75 g of NaOH (solid), provided with a 0.1 μm nickel layer in a commercial nickel bath containing hypophosphite, then copper-plated in a copper plating bath containing formalin to a thickness of approx. 2 μm, washed with $H_2O$ dest., and annealed in a drying oven at 150° C. The specimen thus provided with a well adhering, electrically conducting metal deposit is covered with a screen-printed mask based on polybutadiene which has free raster-type tracks of approximately 100 μm and then the free metal surface is reinforced with electroplated copper to approx. 45 μm. Now the specimen body has the mask removed in methyl ethyl ketone and the Cu deposit deposited thereunder by chemical means is etched off in a solution of 500 ml of $H_2O$ dest., 8.5 ml of HCl (high-purity, 37%) and 18.5 ml of $H_2O_2$ (differential etching).

An electrical conductor based with plated-through holes having approx. 100 μm wide and approx. 40 μm thick conductor tracks is obtained. The metal deposit adheres to the substrate surface extraordinarily well. It can be soldered by conventional methods. The cross-section of the conductor tracks produced in this manner exhibits a rectangular profile.

EXAMPLE 4

The procedure is as in Example 1, but an aqueous bath of the following composition is used instead of the nickel bath:
35 g/l nickel sulphate,
50 g/l iron(II) ammonium sulphate,
75 g/l potassium tartrate,
25 g/l sodium hypophosphite,
  ammonia to pH 9.2
Remainder: water The residence time of the plate in the bath at 25° C. is 5 minutes. Under these conditions, a Ni/Fe layer deposits which contains 12% Fe.

The peel strength of the copper layer deposited thereon is 47 N/25 mm.

EXAMPLE 5

The procedure is as in Example 1, but a cobalt bath of the following composition is used:
50 g/l $CoCl_2.6H_2O$,
20 g/l $NaH_2PO_2.H_2O$
100 g/l tartaric acid,
10 g/l $H_3PO_3$
  sodium hydroxide solution to pH 8.5
Remainder: water The residence time at 40° C. is 3½ minutes.

After copper plating, a copper deposit is formed with a peel strength of 43 N/25 mm.

EXAMPLE 6

The procedure is as in Example 1, but a bath of the following composition is used instead of the nickel bath:
30 g/l $CoCl_2.6H_2O$,
30 g/l $NiCl_2.6H_2O$,
20 g/l $NaH_2PO_2.H_2O$
100 g/l potassium sodium tartrate,
50 g/l $NH_4Cl$
ammonia to pH 8.5
Remainder: water The residence time at 90° C. is 2 minutes.

The peel strength of the copper deposit deposited on the Ni/Co layer thus formed is 46 N/25 mm.

EXAMPLE 7

A commercial polyimide foil, copper-coated on one side, has the Cu deposit removed in an alkaline 15.7% sodium chlorite solution (pH-12), is washed with $H_2O$ and then with methanol, and dried. A foil which is porous at the surface is obtained which has a specific total pore volume per unit area of 0.025 $dm^3/m^2$ and a mean pore diameter of 2.0 μm or a mean pore depth of 2.5 μm. This foil is then activated for 5 minutes in a solution composed of 0.5 g of n-3-heptane-2-one-palladium chloride and 1000 ml of 1,1,1-trichloroethane, dried and then sensitized in a solution composed of 750 ml of $H_2O$ dest., 7.7 g of dimethylamine-borane and 1.75 g of NaOH (solid), nickel-plated in a commercial nickel bath containing hypophosphite, then provided with an approx. 2 μm thick copper layer in a chemical copper bath, washed with water, and annealed in a drying oven for 1 hour at 170° C. The specimen thus provided with a nickel and copper deposit is coated with a resist based on polybutadiene with the aid of the screen printing process, free raster-type tracks of about 200 μm remaining untouched, and then the free metal surface is reinforced with electroplated copper to approx. 35 μm. Now the foil has the mask removed in methyl ethyl ketone and the nickel/copper deposit deposited chemically thereunder is etched off in a sulphuric acid solution containing $H_2O_2$. An electrical circuit is obtained which has approx. 200 μm wide and approx. 32 μm thick conductor tracks.

We claim:

1. A process for producing two-layer electrical conductor boards with plated-through holes from substrates, which are clad on both sides with copper foils, comprising
   (a) removing the copper cladding from said substrates chemically or mechanically after cutting to size and drilling,
   (b) activating the surfaces of said substrates and the drilled hole walls by immersion in an activator bath,
   (c) providing the substrate from (b) with 0.05–2.0 μm thick layer of nickel, cobalt, manganese, a nickel/iron or nickel/cobalt mixture,
   (d) providing the substrate from (c) with a 0.5–5.0 μm thick copper layer in a subsequent copper bath, and
   (d) building up the conductor pattern thereon by semiadditive methods.

2. A process according to claim 1, wherein after removal of the metal cladding, the surface of the substrates is characterized by a specific total pore volume per unit of 0.015 to 0.045 $dm^3/m^2$, a mean pore diameter of 0.05 to 12.0 μm, and a mean pore depth of 0.05 to 4.0 μm.

3. A process according to claim 1, wherein the activation is carried out with organic noblemetal complex compounds.

4. A process according to claim 1, wherein inorganic ionic or colloidal activator systems are used as activators.

5. A process according to claim 1, wherein the metal layer of Ni, Co, Mn or Ni/Co has a thickness of 0.1–1.0 μm.

6. A process according to claim 1, wherein the metal layer applied according to (c) is a nickel layer.

7. A process according to claim 1, wherein the copper layer applied according to (d) has been deposited electrolessly or electrochemically and has a thickness of 1.0 to 3.0 μm.

8. A process according to claim 1, wherein the build-up of the conductor pattern is carried out by a semi-additive differential etching process.

9. A process according to claim 1, comprising sensitizing the substrate prior to carrying out (c).

* * * * *

UNITED STATES PATENT AND TRADEMARK OFFICE
CERTIFICATE OF CORRECTION

PATENT NO. : 4,913,768

DATED : April 3, 1990

INVENTOR(S) : Wolf et al.

It is certified that error appears in the above-identified patent and that said Letters Patent is hereby corrected as shown below:

Col. 8, line 63    Delete " (d) " and substitute -- (f) --

Signed and Sealed this

Nineteenth Day of April, 1994

Attest:

BRUCE LEHMAN

*Attesting Officer*    *Commissioner of Patents and Trademarks*